United States Patent [19]

Ueda et al.

[11] Patent Number: 4,581,627
[45] Date of Patent: Apr. 8, 1986

[54] ENHANCED SILICIDE ADHESION TO SEMICONDUCTOR AND INSULATOR SURFACES

[75] Inventors: Yoshiya Ueda, Yokohama; Fumie Okutsu, Kawasaki; Masaki Momotomi, Yokohama, all of Japan

[73] Assignee: Tokyo Shibaura Denki Kabushiki Kaisha, Japan

[21] Appl. No.: 459,187

[22] Filed: Jan. 19, 1983

[30] Foreign Application Priority Data

Jan. 22, 1982 [JP] Japan .................................. 57-8712

[51] Int. Cl.$^4$ ..................... H01L 27/12; H01L 23/48; H01L 29/46; H01L 29/54
[52] U.S. Cl. ........................................ 357/67; 357/4; 357/65; 357/71; 427/89
[58] Field of Search .................. 357/4, 5, 6, 65, 67 S, 357/71 S, 71 P, 71 R; 427/88, 89, 93

[56] References Cited

U.S. PATENT DOCUMENTS 4,395,813  8/1983  Roth et al. .............................. 357/5
4,404,235  9/1983  Tarng et al. .......................... 427/89

OTHER PUBLICATIONS

H. Roesch et al., "Improving the Adherence of Conductive Patterns to Insulators", *IBM Technical Disclosure Bulletin*, vol. 15, (1973), p. 3087.
S. P. Muraka et al., "Refractory Silicides of Titanium and Tantalum for Low-Resistivity Gates and Interconnects," *IEEE Transactions on Electron Devices*, vol. ED-27 (1980), pp. 1409-1417.
M. A. Nicolet, "Diffusion Barriers in Thin Films," *Thin Solid Films*, vol. 52 (1978), pp. 415-443.
L. Berenbaum, "Coating Narrow Resistive Lines to Increase Electromigration Resistance", *IBM Technical Disclosure Bulletin*, vol. 17 (1975), p. 3280.
Mochizuki et al., "A New MOS Process Using MoSi$_2$ as a Gate Material", 9th Conference on Solid State Devices, Tokyo 1977, Japanese Journal of Applied Physics, vol. 17 (1978) Supplement 17-1, pp. 37-42.

*Primary Examiner*—James J. Carroll
*Attorney, Agent, or Firm*—Finnegan, Henderson, Farabow, Garrett & Dunner

[57] ABSTRACT

The invention provides a semiconductor device in which an insulating film or a semiconductor film is firmly bonded with a metal silicide film, and also provides a method for manufacturing the same. The semiconductor device has a semiconductor substrate with an insulating film or a semiconductor film formed thereon, a carbon layer formed on the insulating film or the semiconductor film, and a metal silicide film formed on the carbon layer. Carbon atoms are thermally diffused by heating from the carbon layer into the insulating film or the semiconductor film and into the metal silicide film.

4 Claims, 4 Drawing Figures

ENHANCED SILICIDE ADHESION TO SEMICONDUCTOR AND INSULATOR SURFACES

BACKGROUND OF THE INVENTION

The present invention relates to a semiconductor device and a method for manufacturing the same and, more particularly, to a semiconductor device having a metal silicide layer tightly adhered to an insulating layer or a semiconductor layer, and a method for manufacturing the same.

In a recent semiconductor device such as a MOSFET (metal oxide semiconductor field effect transistor) shown in FIG. 1, which must satisfy the requirements of high speed and high packing density, a metal such as molybdenum (Mo), tungsten (W) or platinum (Pt) or a silicide thereof is used as a material of a gate electrode 1 in addition to aluminum or polycrystalline silicon. Referring to FIG. 1, reference numeral 2 denotes a p-type silicon substrate; 3, an n-type source region; 4, an n-type drain region; and 5, an insulating film of silicon dioxide ($SiO_2$). When the gate electrode 1 comprises a metal silicide film, the metal silicide film may often peel off from the underlying insulating film 5 as a result of annealing or photoengraving steps which occur after the metal silicide film is formed on the insulating film 5. The metal silicide film may also peel off when it is formed directly on the semiconductor film.

SUMMARY OF THE INVENTION

It is an object of the present invention to provide a semiconductor device in which an insulating film or a semiconductor film is effectively adhered to a metal silicide film formed thereon, and to provide a method for manufacturing the same.

In order to achieve the above object of the present invention, there is provided a semiconductor device comprising a semiconductor substrate having an insulating film or a semiconductor film thereon, a carbon layer formed on said insulating film or said semiconductor film, and a metal silicide film formed on said carbon layer, wherein carbon atoms are thermally diffused by heating from said carbon layer into said insulating film or other semiconductor film and into said metal silicide film.

The carbon layer preferably has a thickness of 20 to 50 Å. Heating preferably is performed by laser beam radiation.

DETAILED DESCRIPTION OF THE PREFERRED EMBODIMENT

The main part of a MOSFET according to an embodiment of the present invention will be described with reference to FIGS. 2 and 3. The source and drain regions are not illustrated in FIGS. 2 and 3.

Figure 1:
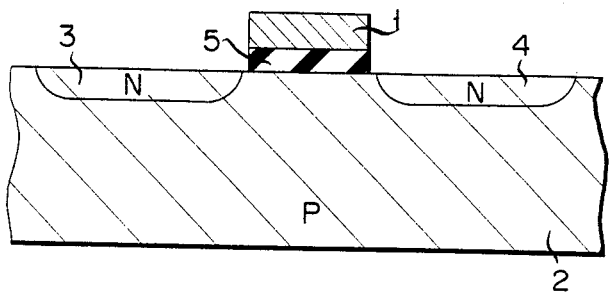
FIG. 1 is a sectional view of a conventional semiconductor device.
Figure 2:
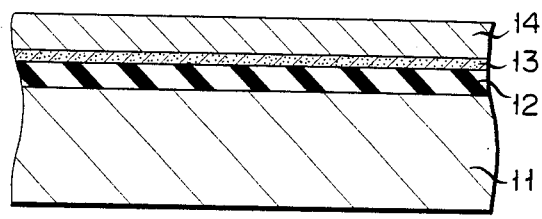
FIG. 2 is a sectional view showing the main part of a semiconductor device according to an embodiment of the present invention before thermal diffusion is performed.
Figure 3:
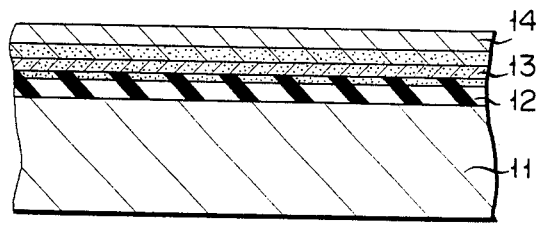
FIG. 3 is a sectional view of the semiconductor device shown in FIG. 2 after thermal diffusion is performed.

Referring to FIG. 2, reference numeral 11 denotes a p-type silicon substrate. An $SiO_2$ film 12 having a thickness of 400 Å is formed by thermal oxidation on the p-type silicon substrate 11. A carbon layer 13 is formed by electron beam evaporation on the $SiO_2$ film to a thickness of 30 Å. A molybdenum silicide ($MoSi_2$) film 14 having a thickness of 3,500 Å is sputtered on the carbon layer 13. The $MoSi_2$ film 14 acts as a gate electrode.

The $SiO_2$ film 12, the carbon layer 13 and the molybdenum silicide layer 14 sequentially formed on the silicon substrate 11 are heated by laser beam radiation. The wavelength of the laser beam is selected so that the laser beam is absorbed in the carbon layer 13. In other words, the wavelength is selected in accordance with the thickness and composition of the molybdenum silicide film 14. FIG. 3 shows the state of the semiconductor device after thermal diffusion is performed by laser beam radiation. Referring to FIG. 3, the carbon atoms from the carbon layer 13 formed on the $SiO_2$ film 12 are diffused into the molybdenum silicide film 14 and the $SiO_2$ film 12 to depths of 200 Å and 50 Å, respectively. The maximum concentration of the carbon atoms in the diffusion regions is about 10%.

Figure 4:
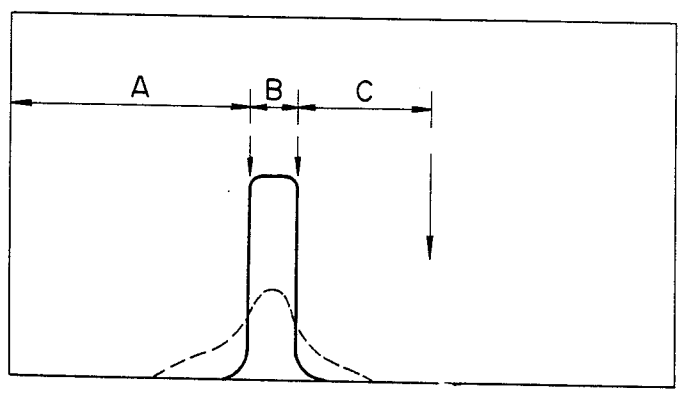
FIG. 4 shows an Auger signal intensity of carbon in the semiconductor device shown in FIGS. 2 and 3 in accordance with Auger electron spectroscopy.

The diffusing state of the carbon layer 13 is checked by Auger electron spectroscopy (AES). Results are shown in FIG. 4. The Auger signal intensity of various atoms of the three-layer structure (the $SiO_2$ film 12, the carbon layer 13 and the molybdenum silicide layer 14) is plotted along an ordinate axis, whereas thickness of each layer of the three-layer structure is plotted along an abscissa axis. Region A indicates a molybdenum silicide region; region B, a carbon region; and region C, an $SiO_2$ region. The intensity of the Auger signal from the carbon region before thermal diffusion by the laser beam is indicated by the solid line, whereas the intensity of the Auger signal from the carbon region after thermal diffusion by the laser beam is indicated by the dotted line on a 5:1 scale on an ordinate axis as compared with the solid line. It is noted that Auger signals of Mo, Si and O of the regions corresponding to the molybdenum silicide film 14 and the $SiO_2$ film 12 are not shown. It is thus found that the carbon atoms are thermally diffused from the carbon layer 13 to the molybdenum silicide film 14 and to the $SiO_2$ film 12.

Adhesion strength between the molybdenum silicide 14 and the $SiO_2$ film 12 is considered to be enhanced by the diffused carbon atoms. Specifically, an intermediate layer is formed which comprises the carbon layer 13 in which an atom radius is small and which does not impair the characteristics of the molybdenum silicide film 14 and the $SiO_2$ film 12. Further, the carbon atoms are diffused from the carbon layer 13 into the molybdenum silicide film 14 and the $SiO_2$ film 12 so as to increase adhesion strength by such diffusion. The resultant molybdenum silicide film 14 may not peel off from the $SiO_2$ film 12 even if the subsequent manufacturing process such as annealing and photoengraving is performed.

Stress of the molybdenum silicide film 14 is also measured. When a molybdenum silicide film is directly formed on the $SiO_2$ film according to a comparative example, it may be greatly deflected in a convex shape during annealing in a nitrogen atmosphere at a temperature of 1,000° C. for 30 minutes. The stress of the molybdenum silicide film itself is $1.9 \times 10^{10}$ dyn/$cm^2$. However, the molybdenum silicide 14 according to the present invention is slightly deflected and has a stress of $5 \times 10^9$ dyn/cm$^2$ when it is annealed in a nitrogen atmosphere at a temperature of 1,000° C. for 30 minutes. The molybdenum silicide film 14 of the present invention has excellent characteristics as compared with that of the comparative example. This improvement is regarded to be attributable to the thermal diffusion of carbon into the molybdenum silicde film 14.

In the above embodiment, a metal silicide film comprises the molybdenum silicide film 14, and a base insulating film comprises the SiO$_2$ film. However, the present invention is not limited to this combination. A metal silicide film such as a tungsten or platinum silicide film may be used in place of the molybdenum silicide film, and an insulating film such as silicon nitride film may be used in place of the SiO$_2$ film.

What we claim is:

1. A semiconductor device comprising a semiconductor substrate with an insulating film formed thereon, a carbon layer formed on said insulating film, and a metal silicide film formed on said carbon layer, wherein carbon atoms are thermally diffused by heating from said carbon layer into said insulating film and into said metal silicide film and said diffused carbon atoms improve adhesion strength between said insulating film and said metal silicide film.

2. A device according to claim 1, wherein said carbon layer has a thickness of 20 to 50 Å.

3. A device according to claim 1, wherein said metal silicide film is made of a material selected from the group consisting of molybdenum silicide, tungsten silicide and platinum silicide.

4. A device according to claim 1, wherein said metal silicide film constitutes a gate electrode.

* * * * *